(12) United States Patent
Stribley et al.

(10) Patent No.: US 12,394,748 B2
(45) Date of Patent: Aug. 19, 2025

(54) SUBSTRATE BONDING

(71) Applicant: PLESSEY SEMICONDUCTORS LIMITED, Plymouth (GB)

(72) Inventors: Kevin Stribley, Plymouth (GB); Reetta Griffiths, Plymouth (GB); Ian Murray, Plymouth (GB); Stuart Brodie, Plymouth (GB); Sharon Farrens, Plymouth (GB)

(73) Assignee: PLESSEY SEMICONDUCTORS LIMITED, Plymouth (GB)

( * ) Notice: Subject to any disclaimer, the term of this patent is extended or adjusted under 35 U.S.C. 154(b) by 472 days.

(21) Appl. No.: 17/776,685

(22) PCT Filed: Nov. 25, 2020

(86) PCT No.: PCT/EP2020/083351
§ 371 (c)(1),
(2) Date: May 13, 2022

(87) PCT Pub. No.: WO2021/105203
PCT Pub. Date: Jun. 3, 2021

(65) Prior Publication Data
US 2022/0399302 A1    Dec. 15, 2022

(30) Foreign Application Priority Data

Nov. 26, 2019  (GB) ..................... 1917182

(51) Int. Cl.
*H01L 23/00*    (2006.01)

(52) U.S. Cl.
CPC ............. *H01L 24/80* (2013.01); *H01L 24/03* (2013.01); *H01L 24/05* (2013.01); *H01L 24/06* (2013.01);
(Continued)

(58) Field of Classification Search
CPC . H01L 2224/08111; H01L 2224/05571; H01L 2224/05551; H01L 2224/75251;
(Continued)

(56) References Cited

U.S. PATENT DOCUMENTS

| 4,818,728 A | 4/1989 | Rai et al. | |
|---|---|---|---|
| 6,756,305 B1 * | 6/2004 | Conn | ............... H01L 24/11 |
| | | | 257/E23.021 |

(Continued)

FOREIGN PATENT DOCUMENTS

| JP | 201621497 A | * | 2/2016 |
|---|---|---|---|
| JP | 2016021497 A | | 2/2016 |

(Continued)

OTHER PUBLICATIONS

International Search Report, PCT/EP2020/083351, dated Mar. 2, 2021, 3 pages.

(Continued)

*Primary Examiner* — Lawrence C Tynes, Jr.
(74) *Attorney, Agent, or Firm* — Stinson LLP

(57) ABSTRACT

A method of preparing a substrate for substrate bonding is provided. The method comprises: forming a recess in a substrate surface of the substrate, and forming a bondable dielectric layer on the substrate surface of the substrate. The bondable dielectric layer has a bonding surface on an opposite side of the bondable dielectric layer to the substrate surface, wherein the recess and the bondable dielectric layer define a dielectric cavity having a dielectric cavity volume. A plug is formed configured to make electrical contact to the substrate in the dielectric cavity volume. The plug has a plug volume which is less than the dielectric cavity volume, wherein the plug extends from the dielectric cavity beyond the bonding surface in a direction generally normal to the bonding surface. The plug is coined by compressing the (Continued)

substrate between opposing planar surfaces such that a contact surface of the plug is made co-planar with the bonding surface.

14 Claims, 7 Drawing Sheets

(52) U.S. Cl.
CPC ...... *H01L 24/08* (2013.01); *H01L 2224/0384* (2013.01); *H01L 2224/03845* (2013.01); *H01L 2224/05541* (2013.01); *H01L 2224/05551* (2013.01); *H01L 2224/05576* (2013.01); *H01L 2224/05639* (2013.01); *H01L 2224/05644* (2013.01); *H01L 2224/05647* (2013.01); *H01L 2224/05669* (2013.01); *H01L 2224/05687* (2013.01); *H01L 2224/0603* (2013.01); *H01L 2224/08145* (2013.01); *H01L 2224/8013* (2013.01); *H01L 2224/80203* (2013.01); *H01L 2224/80895* (2013.01); *H01L 2224/80896* (2013.01); *H01L 2924/12041* (2013.01); *H01L 2924/13091* (2013.01)

(58) Field of Classification Search
CPC ... H01L 2224/75252; H01L 2224/7555; H01L 2224/80047; H01L 24/80
See application file for complete search history.

(56) References Cited

U.S. PATENT DOCUMENTS

| 8,802,538 | B1 | 8/2014 | Liu et al. |
| 2008/0290438 | A1 | 11/2008 | Weng et al. |
| 2011/0233785 | A1* | 9/2011 | Koester ............ H01L 21/76898 257/E21.585 |
| 2011/0241185 | A1* | 10/2011 | Koester ............... H01L 25/0657 257/E21.597 |
| 2013/0020704 | A1 | 1/2013 | Sadaka |
| 2013/0320556 | A1 | 12/2013 | Liu et al. |
| 2014/0117546 | A1 | 5/2014 | Liu et al. |

FOREIGN PATENT DOCUMENTS

| WO | 2004071700 A2 | 8/2004 |
| WO | 2012061008 A1 | 5/2012 |
| WO | 2017035321 A1 | 3/2017 |

OTHER PUBLICATIONS

Written Opinion, PCT/EP2020/083351, dated Mar. 2, 2021, 8 pages.
Great Britain Search Report, Application No. GB1917182.6, dated May 7, 2020, 5 pages.

* cited by examiner

SUBSTRATE BONDING

REFERENCE TO RELATED APPLICATIONS

This application is the 371 U.S. national stage application of International Patent Application No. PCT/EP2020/083351, filed Nov. 25, 2020, which claims the benefit of Great Britain Patent Application No. 1917182.6, filed Nov. 26, 2019, the entire disclosures of which are incorporated herein by reference.

FIELD OF THE DISCLOSURE

The present disclosure relates to the bonding of two substrates. In particular, the present disclosure relates to bonding of a substrate comprising a Group III-nitride.

BACKGROUND

The fabrication of some electronics devices, for example displays, may involve the deposition of a wide range of materials in order to provide all the desired circuitry, semiconductor components, and electrical interconnections. For some electronics devices, the semiconductor components may be fabricated on a separate substrate to the substrate on which the driving circuitry and electrical interconnections may be provided. Accordingly, electronic devices may include a plurality of substrates on which electronic circuits are provided. These substrates may be bonding together wherein an electrical connection is provided formed between the two substrates.

One known process for forming electrical interconnections between substrates is flip-chip bonding. In a flip-chip bonding process, solder bumps may be applied to one or more contact pads of a substrate. The solder bumps are aligned and brought into contact with corresponding contact pads on a second substrate, wherein the solder is reflowed to form an electrical interconnection between the two substrates.

An alternative process for bonding substrates is hybrid bonding. For example, U.S. Pat. No. 8,809,123 discloses a hybrid bonding method for bonding semiconductor wafers. U.S. Pat. No. 8,809,123 discloses that a chemical mechanical polishing (CMP) process may be performed near the end of a fabrication process of a semiconductor wafer. The CMP process may cause dishing of conductive pads provided in a top surface of the semiconductor wafer such that recesses are formed in the conductive pads. Thus, the CMP process results in a first semiconductor device having first conductive pads disposed within a first insulating material on a top surface thereof, the first conductive pads having a first recess on a top surface thereof. A second semiconductor device which is also subjected to CMP polishing may have second conductive pads disposed within a second insulating material on a top surface, the second conductive pads having a second recess on a top surface thereof. A sealing layer may be disposed between the first conductive pads and the second conductive pads in the first recess and the second recess such that the sealing layer bonds the first conductive pads to the second conductive pads. The first insulating material is bonded to the second insulating material.

In general, the above noted substrate bonding methods may be sensitive to variations in substrate thickness, and/or the relative height of electrical interconnects (e.g. solder bumps, contact pads). Substrates and interconnects which are uneven may result in uneven bonding across a surface, resulting in failed interconnections.

The present disclosure seeks to provide an improved method of preparing a substrate for substrate bonding and an improved substrate bonding method which tackles at least one of the problems associated with prior art methods and arrays, or at least, provide a commercially useful alternative thereto.

SUMMARY OF THE DISCLOSURE

According to a first aspect of the disclosure, a method of preparing a substrate for bonding is provided. The method comprises:

i) forming a recess in a substrate surface of the substrate;
ii) forming a bondable dielectric layer on the substrate surface of the substrate having a bonding surface on an opposite side of the bondable dielectric layer to the substrate surface, the recess and the bondable dielectric layer defining a dielectric cavity having a dielectric cavity volume;
iii) forming a plug configured to make electrical contact to the substrate in the dielectric cavity volume, the plug having a plug volume which is less than the dielectric cavity volume, wherein the plug extends from the dielectric cavity beyond the bonding surface in a direction generally normal to the bonding surface; and
iv) coining the plug by compressing the substrate between opposing planar surfaces such that a contact surface of the plug is made co-planar with the bonding surface.

According to the method of the first aspect, a contact surface of a plug is made co-planar with a first bonding surface of a substrate using a coining process.

It will be appreciated by the skilled person that the formation of a contact surface which is co-planar with a bonding surface is challenging. As noted above, CMP processes may result in dishing of a contact surface. Attempting to form a co-planar surface from an as-deposited plug is challenging, as small variations in any of the process for forming the recess, forming the bondable dielectric layer, and/or forming the plug may result in a change in the relative height of the contact surface and the bonding surface. Such variations in the relative height of the surfaces may result in the plug not being capable of forming an electrical connection to a further substrate when bonded.

To account for variations in the as-deposited plug and the variations in the formation of the recess, the method of the first aspect forms the plug such that it extends from the recess beyond the bonding surface in a direction generally normal to the bonding surface. Thus, the method of the first aspect ensures that the coining process can suitably deform the plug. To allow the plug to deform in the desired manner during the coining process, the dielectric cavity of the substrate has a larger volume than the plug such in order to accommodate the coined plug.

In some embodiments, the plug extends from the dielectric cavity beyond the bonding surface by no more than 5 μm. Accordingly, the amount of deformation that the plug needs to undergo during the coining process may be controlled. That is to say, the contact surface of the plug which is made co-planar with the bonding surface may not need to undergo a significant amount of deformation in order to become co-planar with the bonding surface.

In some embodiments, following coining the plug has a cross-sectional area in the plane of the bonding surface of less than 10 μm×10 μm. As such, it will be appreciated that the method of preparing a substrate for substrate bonding may be used with to make electrical interconnections between substrates which have a relatively small surface area. At such surface area dimensions, variations in the bonding surface, for example resulting from dishing, may reduce the reliability of forming electrical interconnections between substrates. Accordingly, the method of the first aspect improves and/or eliminates such problems by providing a contact surface which is co-planar with a bonding surface using a coining process.

In some embodiments, the volume of the dielectric cavity volume is at least 10% greater than the volume of the plug. Accordingly, the dielectric cavity may include some additional volume (i.e. in excess of the plug volume) to take into account process variations in the formation of the plug, dielectric cavity, and/or the recess which may be present across a substrate.

In some embodiments, the method further comprises subjecting the bonding surface to an activation treatment. Activation of the bonding surface may include the use of a plasma treatment process. Activating the bonding surface may provide a plurality of hydroxide ions on the bonding surface which may form bonds via Van der Waals bridging forces with a further substrate. In some embodiments the bonding surface also optionally is exposed to a solution comprising $OH^-$ ions following the activation treatment. The surface treatment using a suitable solution may further increase the density of hydroxide ions on the bonding surface.

In some embodiments, the plug comprises a noble metal. Thus, the plug may comprise an electrically conductive material which is also suitable for use in a coining process in which the plug undergoes plastic deformation. Of course, it will be appreciated that other known materials and alloys may also be suitable for use as a plug in this disclosure.

In some embodiments, the bondable dielectric layer comprises a silicon compound. For example, the bondable dielectric layer may comprise at least one of: Silicon Dioxide, Silicon Nitride, Silicon Oxynitride, or Silicon Carbon nitride. Such silicon compounds may be used to form a direct, fusion bond with a further substrate. Of course, other dielectric materials which can form direct, fusion bonds with substrates may also be suitable for use with the method of this disclosure.

In some embodiments, a plurality of recesses are formed on the substrate surface, and each recess has a plug formed within. That is to say, the method of this disclosure may be used to prepare a substrate for bonding which is intended to form a plurality of electrical interconnections with a further substrate.

In some embodiments, the substrate comprises an array of Group III-nitride LEDs, the plurality of plugs configured to make electrical contact to the array of LEDs, or CMOS electronics devices, the plurality of plugs configured to make electrical contact to the CMOS electronics devices. As such, it will be appreciated that the substrate to be prepared for bonding may incorporate a plurality of electronic devices which are to be electrically connected to a further substrate.

According to a second aspect of the disclosure, a method of bonding a first substrate to a second substrate is provided. The method comprises:
i) preparing the first substrate for bonding comprising:
  forming a first recess in a first substrate surface of the first substrate;
  forming a first bondable dielectric layer on the first substrate surface of the first substrate having a first bonding surface on an opposite side of the first bondable dielectric layer to the first substrate surface, the first recess and the first bondable dielectric layer defining a first dielectric cavity having a first dielectric cavity volume;
  forming a first plug configured to make electrical contact to the first substrate in the first dielectric cavity volume, the first plug having a first plug volume which is less than the first dielectric cavity volume, wherein the first plug extends from the first dielectric cavity beyond the first bonding surface in a direction generally normal to the first bonding surface; and
  coining the first plug by compressing the first substrate between opposing planar surfaces;
ii) providing the second substrate for bonding, the second substrate comprising:
  a second bondable dielectric layer and a second contact layer, provided on a second surface of the second substrate, the second contact layer having a second contact surface which is co-planar with a second dielectric surface of the second bondable dielectric layer to form a second bonding surface;
iii) aligning the first bonding surface of the first substrate opposite the second bonding surface of the second substrate such that the first plug is aligned with the second contact layer; and
iv) bringing the first bonding surface of the first substrate into contact with the second bonding surface of the second substrate and forming a bond between the first plug and the second contact layer under compressive force.

The first substrate may be prepared substantially as described above for the method of the first aspect of the disclosure. The second substrate may be prepared in a variety of ways. For example, in some embodiments the second substrate may be prepared in a similar manner to the first substrate. In other embodiments, the second substrate may be prepared using a CMP process. Once prepared, the two substrates may be bonded together in accordance with the method of the second aspect.

In some embodiments, the first bonding surface and/or the second bonding surface is subjected to an activation treatment. Further, optionally, the first and/or second bonding surface is exposed to a solution comprising $OH^-$ ions following the activation treatment. By activating the bonding surface(s) of the first and/or second substrate prior to bringing the substrates into contact, the first and second bonding surfaces the effectiveness of the formation of the initial bonds through Van der Waals forces may be increased.

In some embodiments, a cross-sectional area of the first plug in the plane of the first bonding surface is less than a surface area of the second contact surface. By providing first and second substrate with different sized/shaped contact surfaces, the first and second substrates may be more tolerant to variations in the alignment of the first and second substrates during bonding.

In some embodiments, providing the second substrate for bonding comprises:
  forming a second recess in the second substrate surface of the second substrate
  forming the second bondable dielectric layer on the second substrate surface of the second substrate having the second bonding surface on an opposite side of the second bondable dielectric layer to the second substrate surface, the second recess and the second bondable dielectric layer defining a second dielectric cavity having a second dielectric cavity volume;
  forming a second plug configured to make electrical contact to the second substrate in the second dielectric cavity volume, the second plug having a second plug volume which is less than the second dielectric cavity volume, wherein the second plug extends from the second dielectric cavity beyond the second bonding surface in a direction generally normal to the second bonding surface; and coining the second plug by compressing the second substrate between opposing planar surfaces such that the second plug forms the second contact layer having the second contact surface which is co-planar with the second bonding surface.

As such, the second substrate may be provided for bonding in a similar manner to the first substrate. That is to say, the second substrate may be prepared for bonding in a similar manner to the first aspect of the disclosure.

In some embodiments, the second contact layer is made co-planar with the second dielectric surface using a chemical mechanical polishing process. As such, the method of bonding according to the second aspect may use a substrate which has been prepared using a CMP process in conjunction with a substrate prepared for bonding in accordance with the first aspect of the disclosure.

BRIEF DESCRIPTION OF THE FIGURES

The disclosure will now be described in relation to the following non-limiting figures. Further advantages of the disclosure are apparent by reference to the detailed description when considered in conjunction with the figures in which.

DETAILED DESCRIPTION

According to an embodiment of the disclosure, a method of preparing a substrate 10 for substrate bonding is provided.

The substrate 10 to be prepared for bonding may be any substrate suitable for use with semiconductor electronics. The substrate 10 may comprise one or more electronics devices, or, may be prepared for substrate bonding prior to the formation of electronics devices on/within the substrate. That is to say, the substrate 10 may be prepared for substrate bonding at an initial fabrication stage following which one or more electronics devices may be formed on/within the substrate 10, or at any other point in the fabrication process of the substrate 10.

The substrate 10 may be formed from a range of materials including silicon, GaN, sapphire, $SiO_2$, or any other known substrate 10 material known in the art. In some embodiments, the substrate may comprise an array of Group III-nitride LEDs. In other embodiments, the substrate may comprise one or more electronics devices formed from Group III-nitrides. For example, in some embodiments, the substrate may comprise a micro-LED display comprising Group III-nitride LEDs. In other embodiments, the substrate 10 may comprise one or more CMOS electronics devices. An example of a substrate comprising Group III-nitride LEDs suitable for use in methods of this disclosure may be found in GB 1911246.5.

It will be appreciated that a substrate 10 according to this disclosure may comprise one or more electronics devices provided either on a surface of the substrate 10, or formed within a portion of the substrate 10. For example, in some embodiments a substrate 10 may comprise CMOS backplane electronics for use in a display. That is to say, the substrate 10 may comprise one or more electronics devices suitable for driving an active matrix display. In some embodiments a substrate 10 may be bonded to a further substrate wherein the substrate 10 comprises one of: a LED display comprising a plurality of Group III-nitride LEDs, and a substrate comprising CMOS backplane electronics, and the further substrate comprises the other of the LED display comprising a plurality of Group III-nitride LEDs and the substrate comprising CMOS backplane electronics.

In order to form electrical connections to the one or more electronics devices of the substrate 10, the substrate 10 may be bonded to a further substrate (e.g. a second substrate 200). The further substrate may comprise further electronics devices or other electrical interconnections. In order to form electrical interconnections between the substrate 10 and the further substrate the method according to this disclosure provides a method of preparing a substrate 10 for substrate bonding in which one or more electrical contacts are formed in a substrate surface 12 to provide a planar surface which can be bonded, and electrically connected, to a further substrate.

Figure 1A:
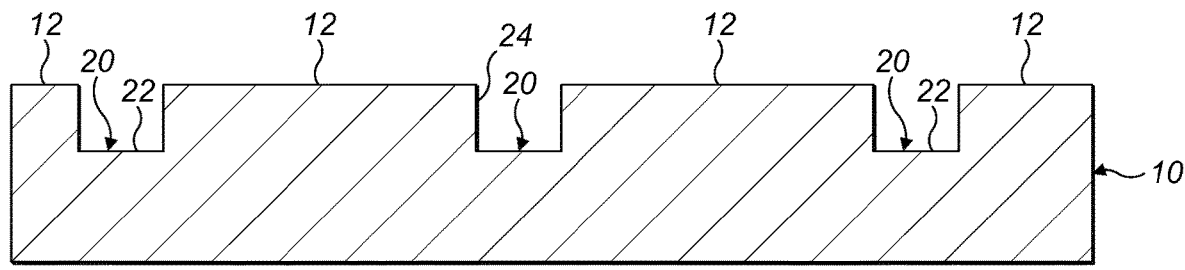
FIG. 1a shows a diagram of a cross section of a substrate with a plurality of recesses.

According to a method of this disclosure a recess 20 is formed in a substrate surface 12 of the substrate 10 to be prepared for bonding. For example, as shown in FIG. 1 a plurality of recesses 20 may be formed in substrate surface 12 of the substrate 10. As shown in FIG. 1, each recess 20 may have generally the same shape (e.g. the same cross section in a plane normal to the substrate surface 12). The recess 20 defines a recess volume of the recess 20. As shown in FIG. 1, the recess 20 defines a recess surface 22 and recess sidewalls 24. In the embodiment of FIG. 1a, the recess surface 22 is generally parallel to the substrate surface 12. Furthermore, in the embodiment of FIG. 1a the recess sidewalls 24 are generally transverse to the recess surface 20. Of course, in other embodiments different shaped recesses may be provided. For example, the recess sidewalls 24 may be inclined, or sloped, relative to the recess surface 22. When viewing the substrate surface 12 in a plan view it will be appreciated that the intersection between the recess sidewalls 24 and the substrate surface 12 defines an opening in the substrate surface 12 (i.e. a recess surface area). The shape of the opening (recess surface area) in a plan view may be any suitable shape for containing the plug within the recess 20. For example, in some embodiments the recess 20 may have a generally rectangular-shaped surface area when viewed in a plan view. Of course, in other embodiments the recess 20 may have different shaped surface area when viewed in plan, for example: circular, elliptical, quadrilateral, triangular, or any other polygon shape.

The recesses 20 in the substrate surface 12 may be formed by any suitable method known in the art for forming recesses in a substrate 10. For example, the recess 20 may be formed by an etching process. Such etching processes are well known to the skilled person and are not discussed further here.

Following the formation of one or more recesses 20, a bondable dielectric layer 30 is formed on the substrate surface 12 of the substrate 10. The bondable dielectric layer 30 has a bonding surface 32 on an opposite side of the bondable dielectric layer 30 to the substrate surface 12. For example, in the embodiment of FIG. 1b, the bondable dielectric layer 30 may be formed over substantially all of the substrate surface 12 including covering at least a portion of the recess 20. In some embodiments, the bondable dielectric layer 30 may cover all of the surfaces of each of the recesses 20 (recess surface 22, recess sidewalls 24).

The bonding surface 32 has an opening where each of the recesses 20 in the substrate are provided. Each opening in the bonding surface 32 defines a dielectric cavity 34 in the region of the recess 20. Each dielectric cavity 34 has a dielectric cavity volume which is defined by the volume below the plane of the bonding surface 32 where the recess 20 is provided, less any of the bondable dielectric layer 30 which may be present in the recess 20.

Figure 1B:
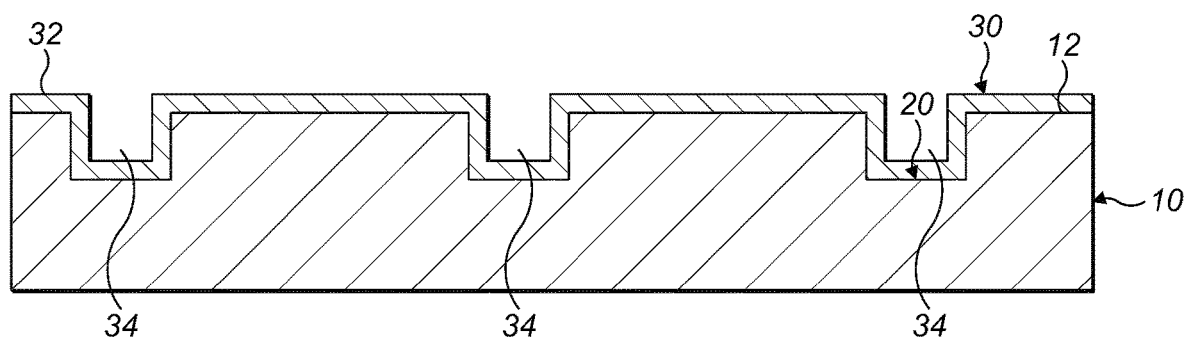
FIG. 1b shows a diagram of a cross section of a substrate with a plurality of recesses and a bondable dielectric layer.

In the embodiment of FIG. 1b, the bondable dielectric layer 30 is provided in each of the recesses 20. As shown in FIG. 1, the bondable dielectric layer 30 may cover the recess surface 22 and the recess sidewalls 24. The bondable dielectric layer 30 is also provided on the substrate surface 12 to define the bonding surface 32. The relative thicknesses of the bondable dielectric layer provided on the substrate surface 12, the recess surface 22, and the recess sidewalls 24 may, in some embodiments be different. In other embodiments, the thickness of bondable dielectric layer 30 may be substantially the same. Accordingly, it will be appreciated that the dielectric cavity volume of dielectric cavity may be different, or the same as, the volume of the recess 20. Depending on the relative thickness of the bondable dielectric layer 30, and the extent to which it is provided in the recess 20, the dielectric cavity volume may be less than, the same, or greater than the volume of the recess 20.

The bondable dielectric layer 30 may comprise a silicone compound. For example, the bondable dielectric layer may comprise at least one of: silicon dioxide, silicon nitride, silicon oxynitride, or silicon carbon nitride. The bondable dielectric layer 30 may be provided in order to provide a bonding surface 32 for bonding to a further substrate. The bondable dielectric layer 30 may form direct bonds (fusion bonds), with a further substrate via the bonding surface 32 of the bondable dielectric layer 30.

The method further comprises forming a plug 40 configured to make electrical contact to the substrate 10 in the dielectric cavity 34 of the substrate 10. For example, in the embodiment of FIG. 1c, a plug 40 is formed on the bondable dielectric layer 30 in each of the dielectric cavities 34. The plugs 40 are provided to make electrical contact to the substrate 10. In particular, the plugs 40 are provided to make electrical contact to electrical devices that may be present in the substrate 10, or may be subsequently formed in/on the substrate in a subsequent series of fabrication processes. In embodiments where the bondable dielectric layer 30 is provided on all the surfaces of the recess 20 it will be appreciated that some parts of the bondable dielectric layer 30 within the recess may be removed (not shown) in order to make the desired electrical connections. Of course in other embodiments, where the bondable dielectric layer 30 does not cover all the surfaces of the recess 20 (recess surface 22, recess sidewalls 24), an electrical connection can be made to the substrate without removing a portion of the bondable dielectric layer 30.

Each plug 40 formed in the dielectric cavity 34 has a dielectric cavity volume. The plug volume is less than a dielectric cavity volume of the dielectric cavity 34. That is to say, the volume of the material which the plug 40 comprises can be contained within the dielectric cavity volume of the dielectric cavity 34 without protruding past the plane of the bonding surface 32 of the bondable dielectric layer 30.

Figure 1C:
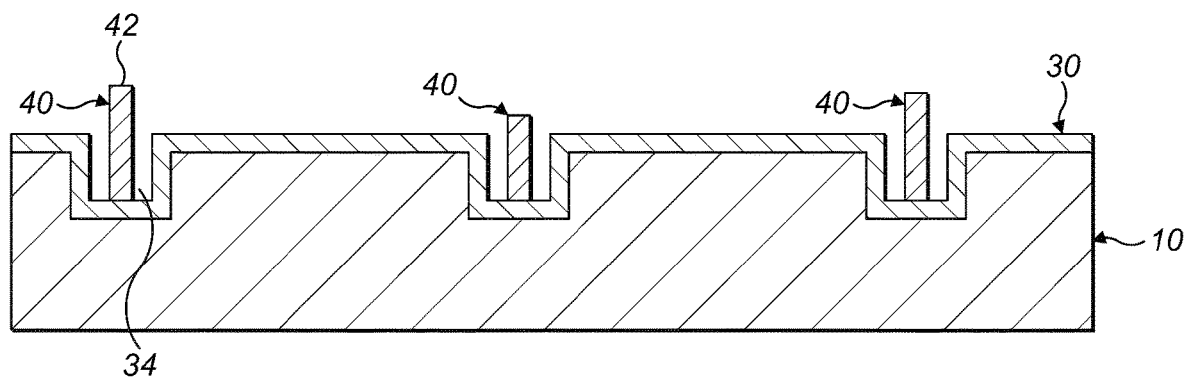
FIG. 1c shows a diagram of a cross section of a substrate with a plurality recesses, a bondable dielectric layer and a plurality of plugs.

The plugs 40 may be formed in a dielectric cavity 34 by a deposition method. The as-formed plugs 40 extend from a respective dielectric cavity 34 in a direction generally normal to the bonding surface 32. As shown in FIG. 1c, each as-formed plug 40 extends (protrudes) from a dielectric cavity 34 beyond the bonding surface 32. As such, the as-formed plugs 40 each extend through the plane of the bonding surface 32. It will be appreciated that due to variations in the deposition method for forming the plugs 40 the distance that each as-formed plug 40 extends beyond the plane of the bonding surface 32 may vary. That is to say, across a substrate 10 the distance that the as-formed plugs 34 extend beyond the bonding surface may not be uniform. For example, in some embodiments, the distance that the as-formed plugs 34 extend beyond the bonding surface may vary by up to 1 μm (i.e. +1-500 nm from a nominal distance).

Each plug 40 may have a contact surface 42 for forming electrical contact with a further substrate. The contact surface 42 may be provided on an opposite side of the plug 40 to the recess surface 22 of the recess 20. As such, the contact surface 42 is a surface of the as-formed plug 40 which extends beyond the plane of the bonding surface 32 for the as-formed plug 40. Following coining (discussed below), the contact surface 42 is be a surface of the plug 40 which is generally aligned with the bonding surface 32 (co-planar).

In some embodiments, the as-formed plugs 40 may extend from the dielectric cavity volume beyond the bonding surface 32 by no more than: 5 μm, 2 μm, 1 μm, or 500 nm. By providing as-formed plugs 40 which protrude a limited distance from the bonding surface 32, the as-formed plugs 40 may be more easily deformed into the desired shape in the subsequent coining process. It will be appreciated that the further the as-formed plugs 40 extend from the bonding surface 32 whilst still complying with the volume requirements of the dielectric cavity volume may become relatively thin and thus may not be as reliably deformed by the coining process.

In some embodiments, the as-formed plugs 40 may extend from the dielectric cavity volume beyond the bonding surface 32 by at least: 200 nm, 300 nm, or 500 nm. By providing the plugs with a minimum protrusion distance, the as-formed plugs 40 may be reliably coined in a subsequent process.

Each as-formed plug 40 extends through the plane of the bonding surface 32. In some embodiments, a cross-sectional area of the plug 40 in the plane of the bonding surface 32 is less than 10 μm×10 μm. That is to say, the cross-sectional area of the plug may be contained within a 10 μm×10 μm square. The cross sectional area of each plug may be provided in a variety of shapes (e.g. elliptical, rectangular etc). The design and formation of various shapes electrical contacts are well known to the skilled person. The plugs 40 may be patterned using lithography. The plugs 40 may be deposited using any suitable deposition process, for example sputtering, evaporation, or electroplating.

In some embodiments, the volume of the dielectric cavity volume is at least 10% greater than the volume of the plug 40. Accordingly, the dielectric cavity volume may provide space into which the plug 40 can deform. Furthermore, providing a volume difference allows for small variations in the volume of the dielectric cavity volume and/or the plug volume resulting from the respective formation processes thereby improving the reliability of the method of preparing a substrate for bonding.

In some embodiments, the plug comprises a plastically deformable material. That is to say, the as-formed plug 40 is configured to be plastically deformed via the coining process. The plug 40 comprises an electrically conductive material. For example, in some embodiments the plug 40 comprises a noble metal such as gold, silver, copper or platinum. Such noble metals are electrically conductive and are also suitable for use in a cold-working process such as coining. In some embodiments, the plugs 40 may comprise a material for forming a eutectic bond with a contact surface of a further substrate. As such, the plug 40 may comprise a material configured to produce a eutectic alloy at a predetermined lower temperature than the melting point of resulting alloy.

Following the formation of the plug 40 in the dielectric cavity 34, the method comprises coining the plug 40. Coining the plug 40 comprises compressing the substrate 10 between opposing planar surfaces 50, 51 such that the contact surface 42 of the plug 40 is made co-planar with the bonding surface 32. The opposing planar surfaces for coining the plugs 40 may be provided by a press, or similar wafer bonding tool.

Figure 2:
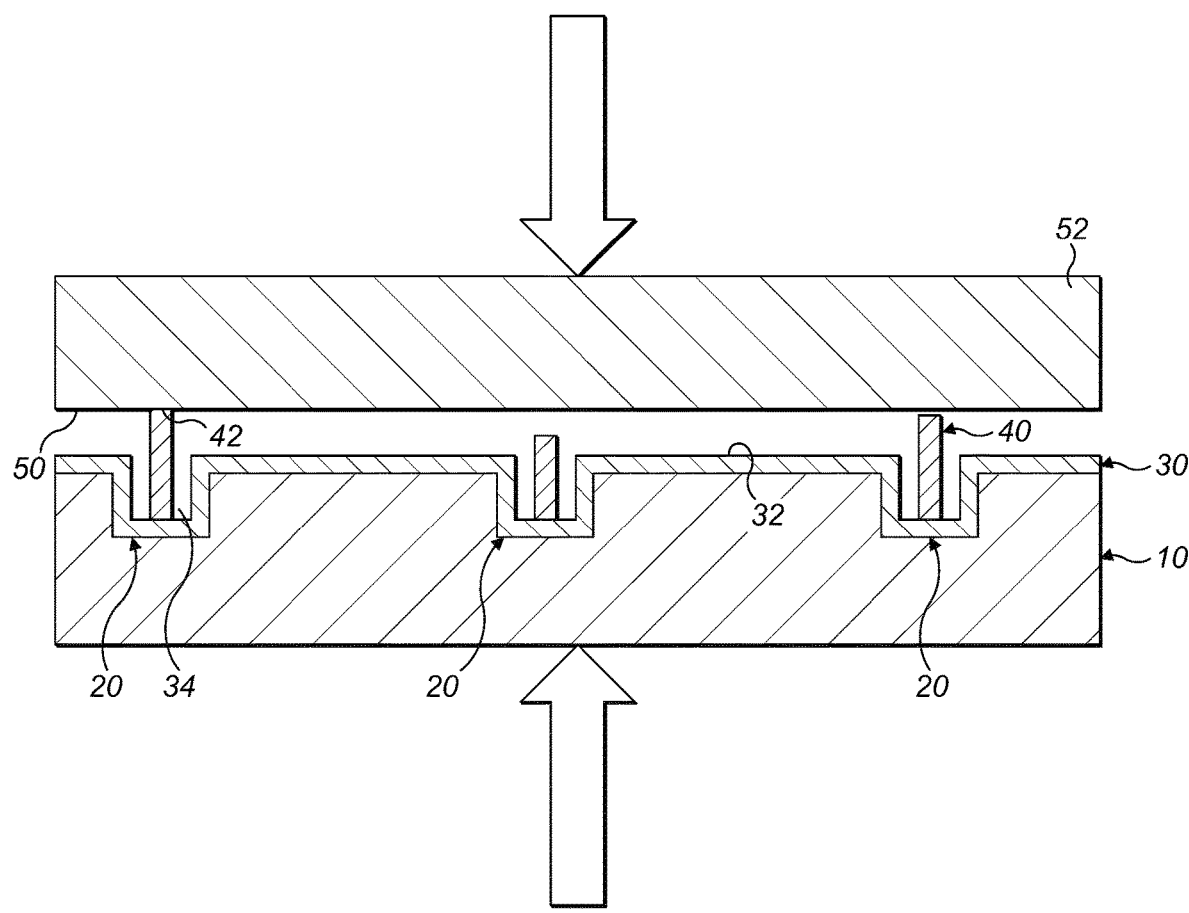
FIG. 2 shows a diagram of a cross section of a substrate comprising a plurality of plugs being coined with a compression substrate.

In the embodiment shown in FIG. 2, the bonding surface 32 (and the contact surface 42) may be compressed (coined) using a first compression substrate 52 which provides a first planar surface 50 for contact with the bonding surface 32. In the embodiment of FIG. 2, the first compression substrate 52 is comprises a polished silicon wafer or a glass substrate. The compression substrate 52 may be chosen to provide a first planar surface 50 for coining the plugs 40. In some embodiments, the first planar surface 50 may have a surface roughness (arithmetical mean surface roughness $R_a$) of no greater than 2 nm, or no greater than 1 nm. The first planar surface 50 of the compression substrate 52 may be configured to reduce and/or prevent cold welding between the compression substrate 52 and the plugs 40/bonding surface 32 of the substrate 10. As such, the first compression substrate 52 may provide a first planar surface 50 which has a relatively low degree of stiction with the plugs 40 and the bonding surface 32.

Figure 3A:
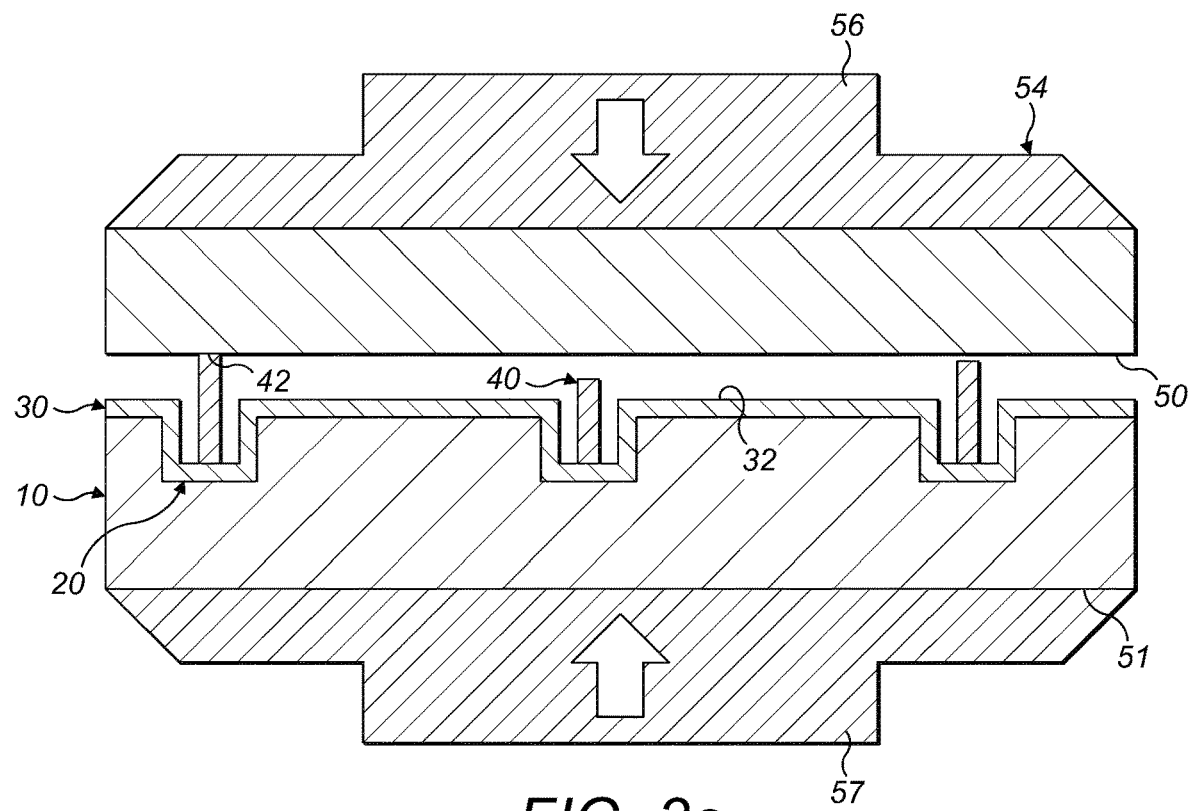
FIGS. 3a and 3b show further diagrams of a substrate being coined in a press.
Figure 3B:
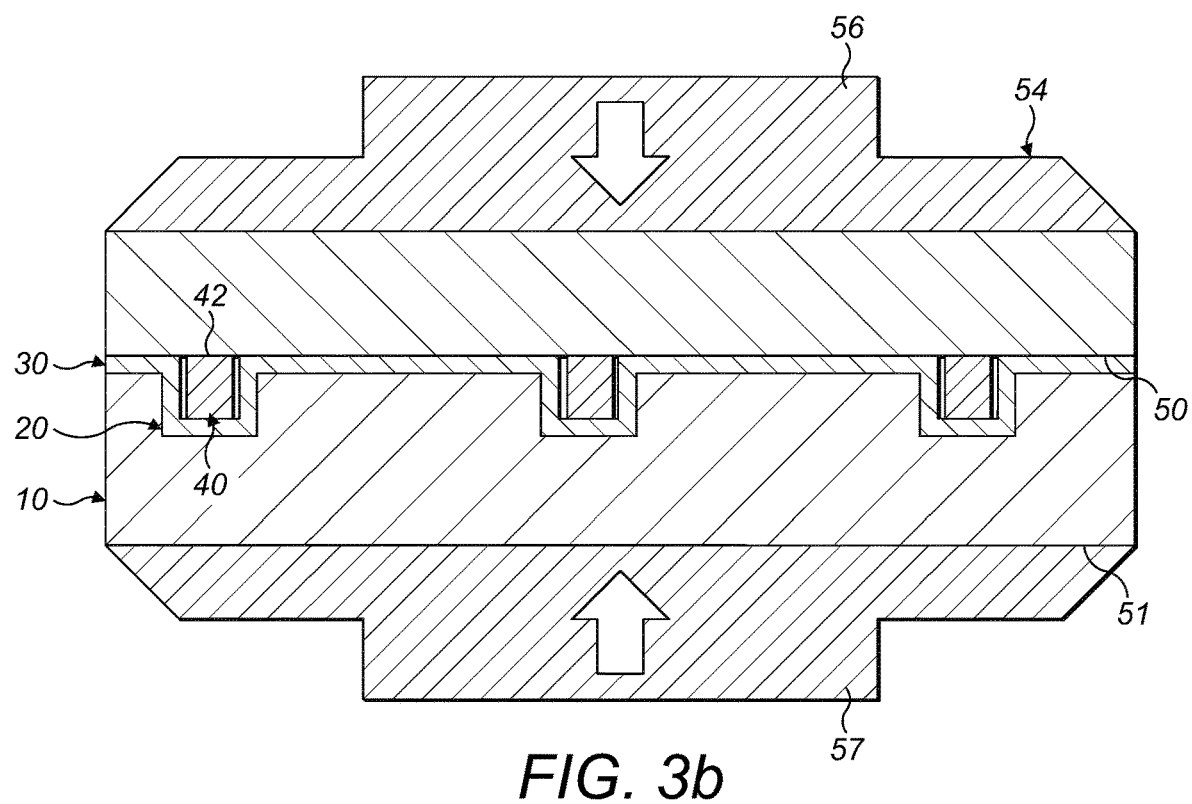

As shown in FIG. 3, coining the plugs 40 comprises compressing the substrate between opposing planar surfaces 50, 51. The opposing planar surfaces 50, 51 are provided parallel to the bonding surface of the substrate. As shown in FIG. 3, a press 54 is provided for compressing the substrate 10. The press comprises a first press portion 56 and a second press portion 57. The second press portion 57 provides the second planar surface 51 for compressing the substrate 10. In the embodiment of FIGS. 3a and 3b, the compression substrate 52 is placed between the first press portion 56 and the substrate 10 for coining. Coining involves compressing the substrate 10 from a side of the substrate 10 opposite the bonding surface 32 and from the side of the substrate on which the bonding surface 32 is provided. Accordingly, the plugs 40 which protrude from the bonding surface 32 are coined such that the contact surface 42 of each plug 40 is made co-planar with the bonding surface 32. It will be appreciated that coining is a method of plastically deforming a material by pressing a material. Coining is typically a cold working process which can be used to shape a, typically, metallic material.

As the plugs 40 are coined, the plug volume is pressed into the dielectric cavity. It will be appreciated that as the dielectric cavity volume is larger than the plug volume, the plug 40 may be coined such that the volume of the plug may fit within the dielectric cavity 34 without protruding from the bonding surface 32. As the plugs 40 are coined by a planar surface 50, the contact surface 42 of each plug may also become co-planar with the bonding surface planar surface 50, and also the bonding surface 32 as the first planar surface 50 is brought into contact with the bonding surface 32. For example, in some embodiments, following coining the contact surfaces 42 of the plugs 40 are made co-planar with the bonding surface such that a surface roughness ($R_a$) in the plane of the bonding surface 32 and contact surfaces 42 is no more than 2 nm. That is to say, the distance that the coined plugs 34 extend beyond the bonding surface may be reduced to less than 2 nm. Accordingly, through use of the coining process the contact surfaces 42 may be made co-planar with the bonding surface. As such, the method of preparing a substrate for substrate bonding provides a contact surface which reduces and/or eliminates dishing in a contact surface.

In some embodiments, the method further comprises subjecting the bonding surface 32 to an activation treatment. The activation treatment may be provided to activate the atoms on the bonding surface 32 for forming further bonds with a further substrate. For example, the activation treatment may comprise a plasma activation treatment, wherein the bonding surface 32 is exposed to a plasma. Any suitable plasma activation treatment known to the skilled person may be used, for example exposure to a plasma comprising nitrogen, oxygen, air, water or ammonia may be used. The plasma activation treatment may result in the formation of activated hydroxide groups being present on the bonding surface 32 of the substrate.

In some embodiments, the method may also comprise of subjecting the bonding surface 32 to a hydroxide treatment process. For example, the hydroxide treatment process may comprise exposing the bonding surface 32 to $OH^-$ ions. In some embodiments the hydroxide treatment may be performed following the activation treatment. A solution comprising $OH^-$ ions may comprise water or a solution of ammonium hydroxide. Activating the bonding surface 32 through the activation treatment, and optionally the hydroxide treatment process, will increase the bondability of the bonding layer 32 to bond to a further substrate.

Figure 4:
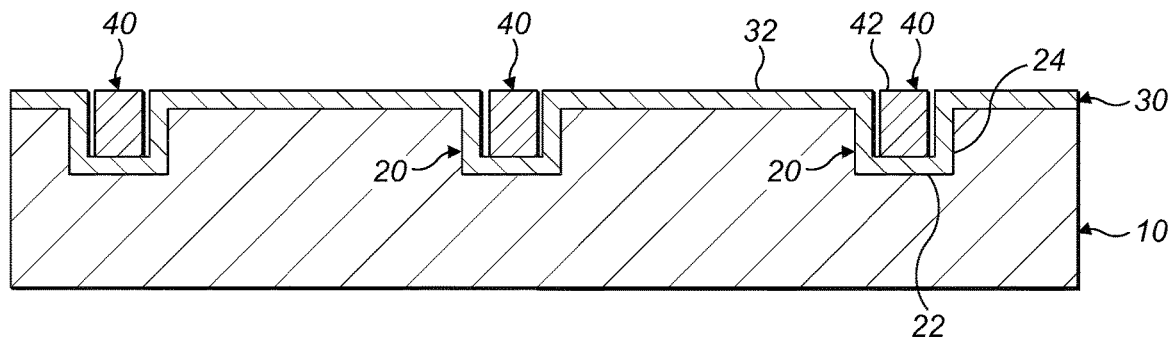
FIG. 4 shows a diagram of a cross section of a substrate which has been prepared for substrate bonding.
Figure 5:
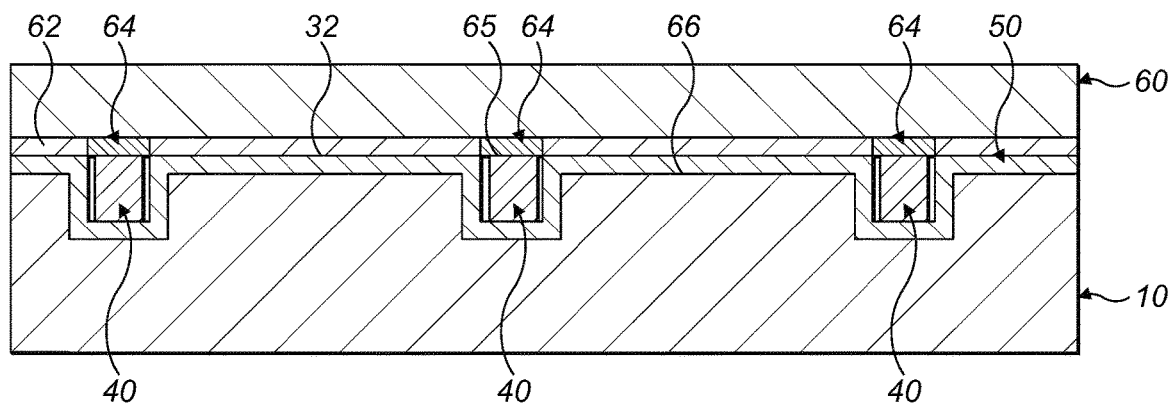
FIG. 5 shows a diagram of a cross section of a substrate bonded to a further substrate.

FIG. 4 shows an example of a substrate 10 which has been prepared for substrate bonding according to an embodiment of this disclosure. The substrate 10 comprises a substrate surface 12 on which a bondable dielectric layer 30 is provided. The bondable dielectric layer 30 comprises a plurality of openings in which dielectric cavities 34 are formed. In each dielectric cavity 34 a plug 40 is provided. Each of the plugs 40 has been coined such that a contact surface 42 of the plug is co-planar with the bonding surface of the bondable dielectric layer 30. FIG. 5 shows a further substrate 60 to which the substrate 10 is bonded along the bonding surface 32 and the contact surfaces 42 of the plugs 40.

Next, a method of bonding a first substrate 10, 100 to a second substrate 60, 200 will be described. The method comprises providing a first substrate 10, 100 for bonding, providing a second substrate 60, 200 for bonding, aligning the first substrate 10, 100 and the second substrate 60, 200, and bringing the first substrate 10, 100 into contact with the second substrate 60, 200 such that a bond is formed between the first and second substrates under a compressive force.

The first substrate 10, 100 may be provided for substrate bonding by preparing the substrate for bonding in accordance with the method for preferring a substrate for bonding described above. As such, the first substrate 10, 100 has a first bonding surface 32 formed from a first bondable dielectric layer 30 and a one or more openings in which a first contact surface 42 of a first plug 40 is provided, wherein each of the first contact surfaces 42 are co-planar with the first bonding surface 32.

The second substrate 60, 200 for bonding to the first substrate may be provided in a variety of ways. In the embodiment of FIG. 5, the second substrate for bonding comprises a second bondable dielectric layer 62 and a second contact layer 64 provided on a second surface 61 of the second substrate 60. The second contact layer 64 may have a second contact surface 65 which is co-planar with a second dielectric surface 63 to form a second bonding surface 66. Such a second substrate may be provided for bonding using a variety of methods for preparing a substrate for bonding known to the skilled person. For example, in the embodiment of FIG. 5 the second substrate 60 may be prepared using a chemical mechanical polishing process known to the skilled person.

In some embodiments the second substrate 200 may be prepared for bonding in substantially the same way as the first substrate 10. For example, FIG. 6 shows an embodiment in which a first substrate 10 and a second substrate 200 have been prepared for bonding in accordance with the method outlined above and subsequently brought into contact and bonded.

Figure 6:
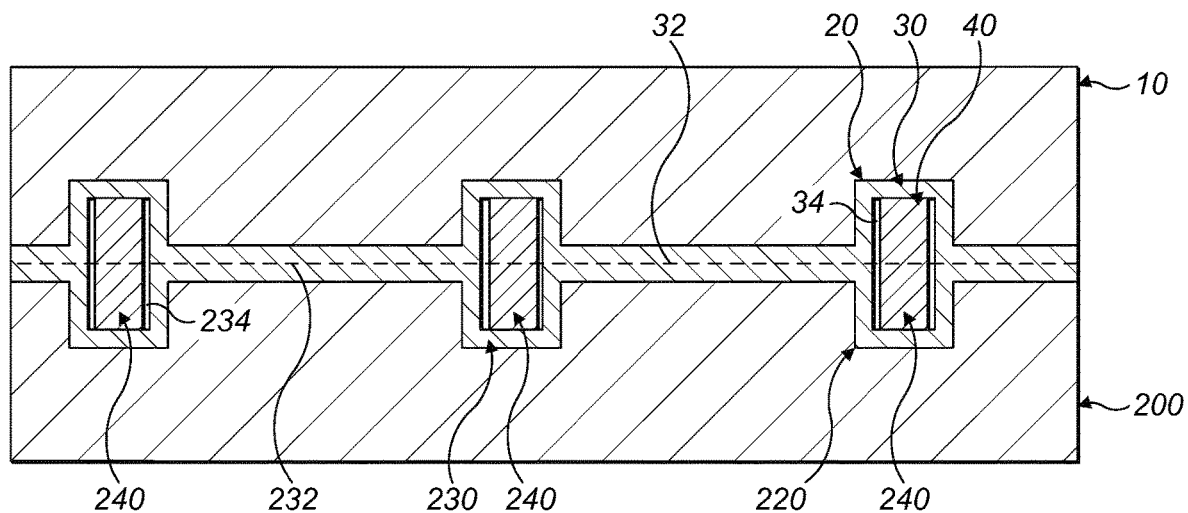
FIG. 6 shows a diagram of a cross section of a first substrate bonded to a second substrate.

As shown in FIG. 6, the step of aligning the first substrate 10 and the second substrate 200 may be provided such that a first plug 40 of the first substrate 10, is aligned with a second plug 240 of the second substrate 200. The alignment of the substrates 10, 200 for bonding is known to the skilled person. For example, suitable alignment marks may be provided on each of the first substrate 10 and the second substrate 200 to allow the plugs 40, 240 of each of the first and second substrates 10, 200 to be aligned.

The first bonding surface 32 of the first substrate 10 may then be brought into contact with the second bonding surface 232 of the second substrate 200 in order to form bonds between the respective bonding surfaces. Some compressive force is provided in order to urge the surfaces into contact and to form the bond between the bondable dielectric layers and the first and second plugs.

Figure 7:
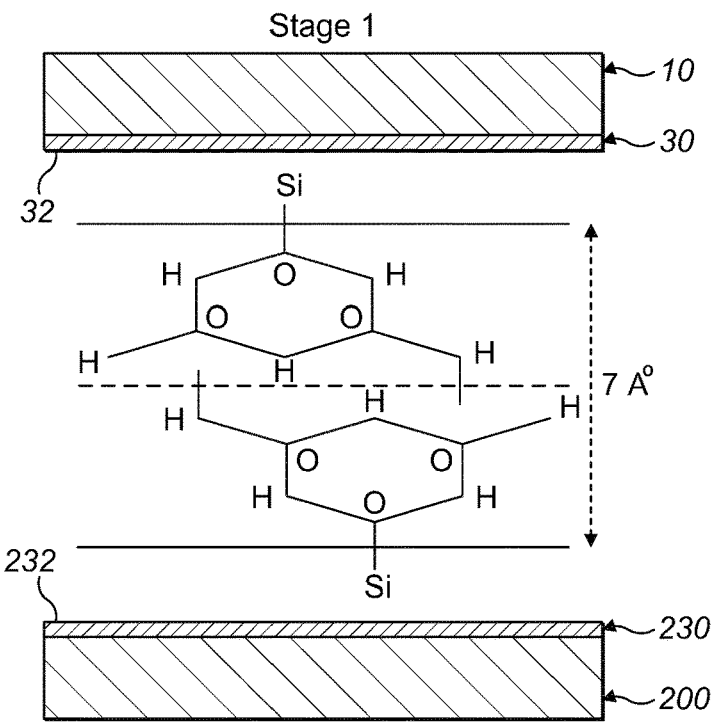
FIG. 7 shows a diagram of a first stage of the bonding process at an interface between a first substrate and a second substrate.
Figure 8:
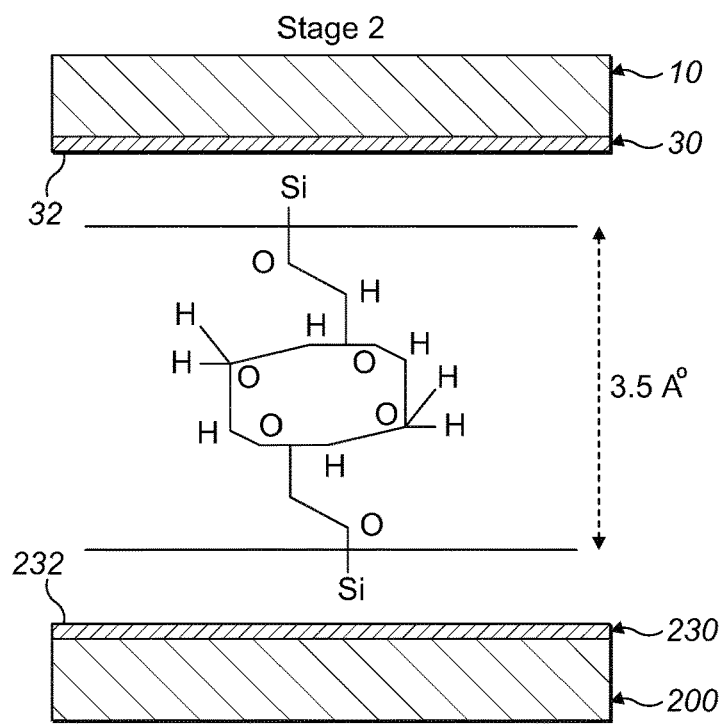
FIG. 8 shows a diagram of a second stage of the bonding process at an interface between a first substrate and a second substrate.
Figure 9:
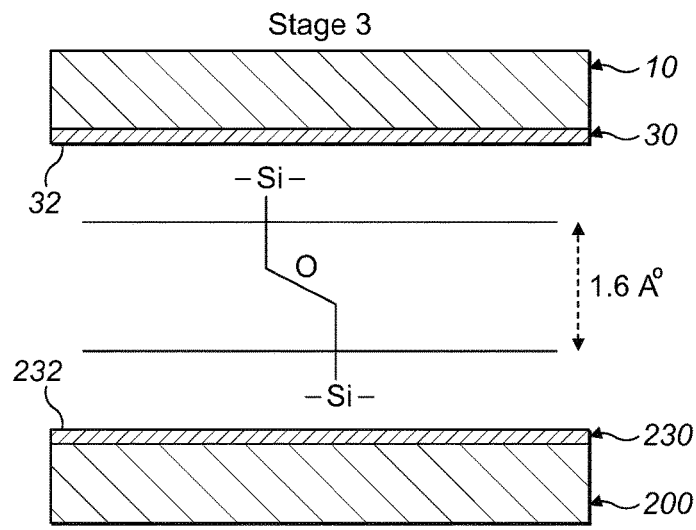
FIG. 9 shows a diagram of a first stage of the bonding process at an interface between a first substrate and a second substrate.

In some embodiments, the first bonding surface 32 and/or the second bonding surface 232 may be subjected to an activation treatment. For example, the activation treatment may be the activation treatment substantially as discussed above in the method of preparing the substrate for bonding. Following activation of the first bonding surface 32 and/or the second bonding surface 232, the surfaces may comprise hydroxide ions. FIGS. 7, 8 and 9 show schematic diagrams of the interactions between hydroxide ions on the first and second bonding surfaces 32, 232 which lead to the formation of a direct, fusion bond between the first and second substrates 10, 200.

As shown in FIG. 7, as the substrates 10, 232 are brought into contact Van der Waals bridging forces occur between the first and second substrates at an initial contact point. Subsequently, as shown in FIG. 8, cyclic tetramer bridging between substrates occurs resulting in the formation of covalent bonds between the first and second bonding surfaces 32, 232. Finally, as shown in FIG. 9 the substrates are bonded together through the formation of covalent bonds formed between first and second bondable dielectric layers 30 232. The formation of the final covalent bonds as shown in FIG. 9 may follow after an annealing step.

Accordingly, the structure shown in FIG. 6 may comprise a first bondable dielectric layer 30 which is directly (fusion) bonded to the second bondable dielectric layer 230 of the second substrate 200 along the interface between the first and second bonding surfaces 32, 232. The structure shown in FIG. 6 also comprises first and second plugs 40, 240 which are bonded together at the interface of the respective contact surfaces 42, 242 thereby forming electrical interconnections between the first and second substrates 10, 200.

In the embodiment of FIG. 6, the first and second dielectric cavities of the first and second substrate 10, 200 are generally of the same size and shape. Accordingly, the first surface area of the first contact surface 42 is generally the same as the second surface area of the second contact surface 242. In other embodiments, the first contact surface 42 and the 242 second contact surface may have different shapes and/or sizes. By providing the first and second contact surfaces 42, 242 with different sizes/shapes, the tolerances for aligning the first and second substrates may be improved.

Figure 10:
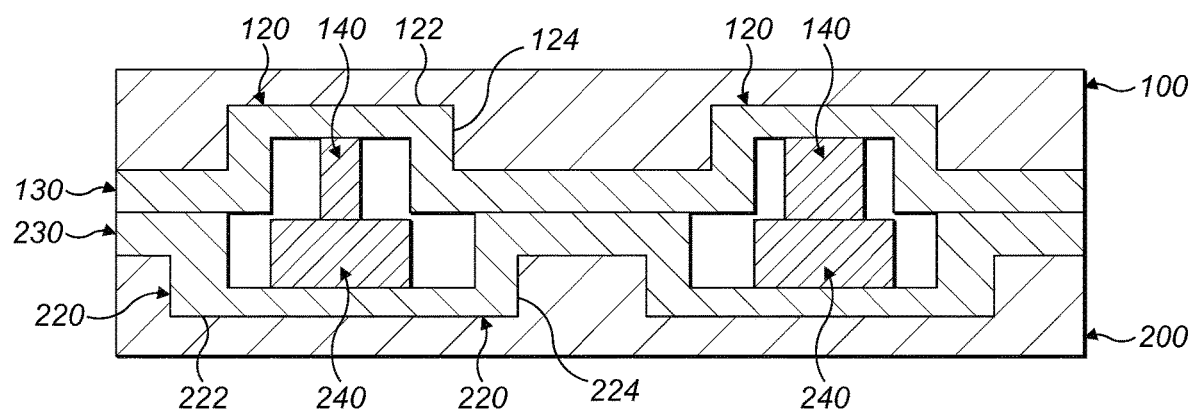
FIG. 10 shows a diagram shows a cross section of an embodiment in which a first substrate is bonded to a second substrate.

The first substrate 100 of FIG. 10 has been prepared for substrate bonding substantially in accordance with the method of substrate bonding described above.

FIG. 10 shows a cross section of an embodiment in which a first substrate 100 is bonded to a second substrate 200. Accordingly, the first substrate 100 comprises a substrate surface 112 on which a first bondable dielectric layer 130 is provided. The first bondable dielectric layer 130 comprises a plurality of openings in which first dielectric cavities 134 are formed. In each first dielectric cavity 134 a first plug 140 is provided. Each of the first plugs 140 has been coined such that a first contact surface 142 of each plug 140 is co-planar with the first bonding surface 132 of the first bondable dielectric layer 130. In the embodiment of FIG. 10, the first contact surface 142 has a surface area which is smaller than the surface area of the second contact surface 242.

Figure 11:
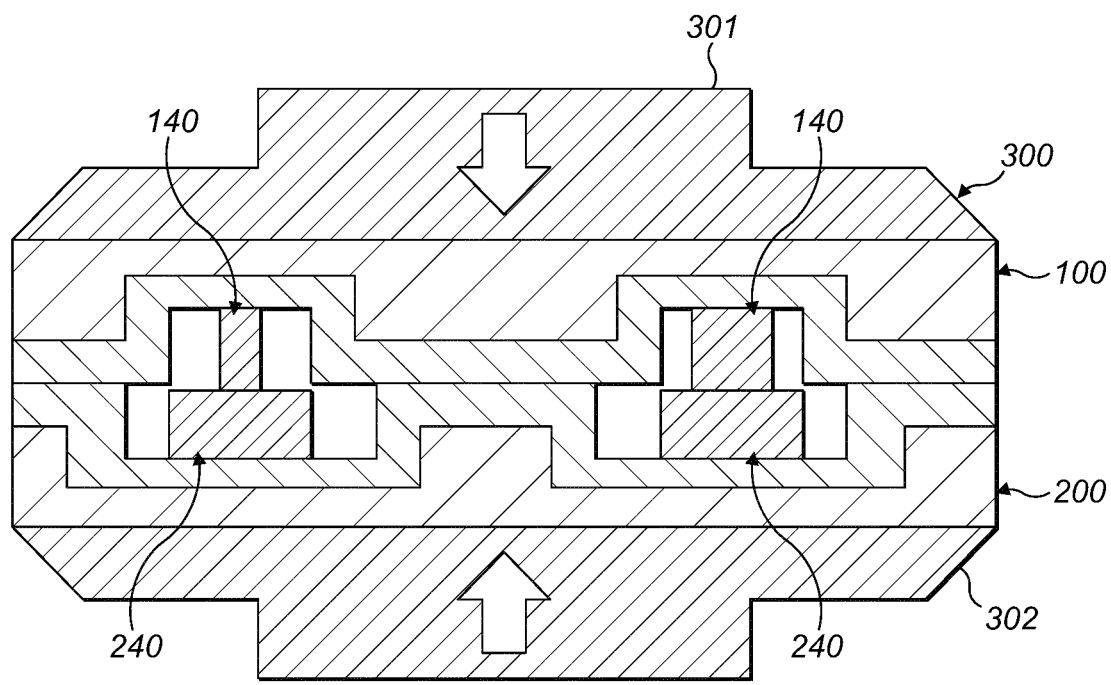
FIG. 11 shows a cross section of an embodiment in which a first substrate is bonded to a second substrate using a press.
Figure 12:
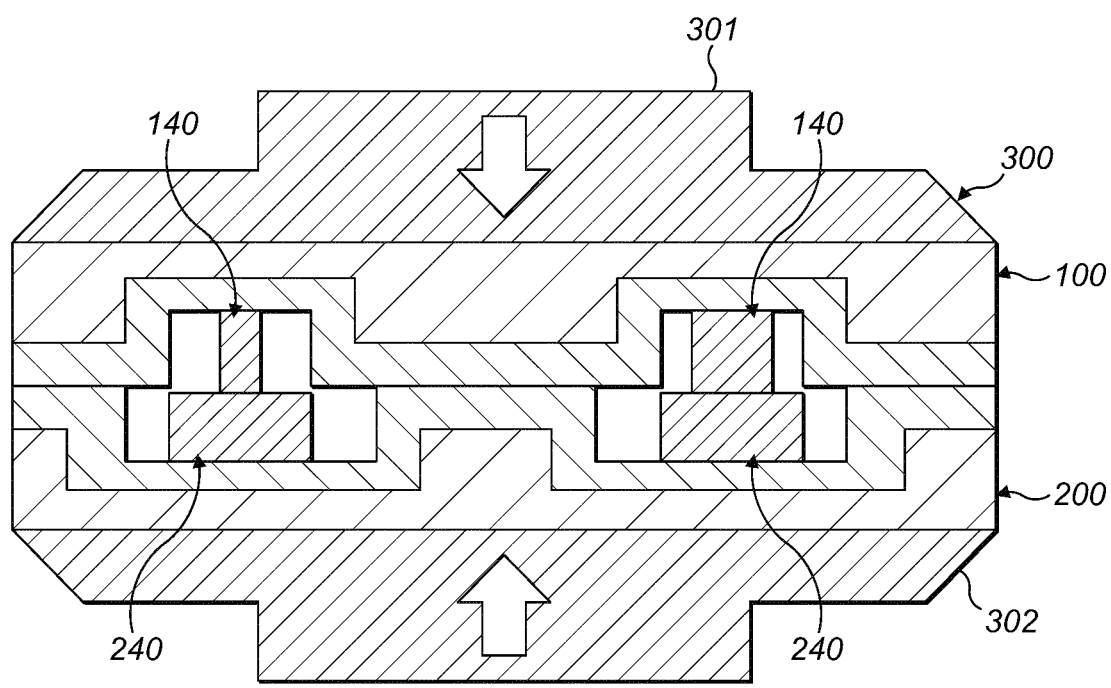
FIG. 12 shows a further cross section of an embodiment in which a first substrate is bonded to a second substrate using a press.

When bringing the first substrate 100 into contact with the second substrate 200, the first contact surface 142 may directly contact the second contact surface 242. As shown schematically in FIG. 10 (see detail A), due to process variations the direct contact between the first contact surface 142 and the second contact surface 242 may not be continuous across the interface between a first plug 140 and a corresponding second plug 240. As shown in FIGS. 11 and 12, the first and second substrates 100, 200 may be pressed together under compressive force using a press 60. The press 60 may also be heated in order to heat the first and second substrates 100, 200.

In some embodiments, the application of heat to the first and second plugs 140, 240 may cause thermal expansion of the plugs 140, 240 thereby causing the first contact surface 142 to form a direct bond with the second contact surface 242. Thus, as shown schematically in FIG. 12, the application of heat and compressive force may improve the interface between corresponding first and second plugs 140, 240 when bonding the first and second substrates 100, 200.

The press of FIGS. 11 and 12 may apply a compressive force of at least 10 kN for bonding the first and second substrates 100, 200. In some embodiments, the press of FIGS. 11 and 12 may apply a compressive force of at least 20 kN, 30 kN, or 40 kN. By applying a larger compressive force to the substrates to be bonded, the reliability of forming the bond between substrates may be improved. In some embodiments, the press may apply a compressive force of no greater than 45 kN in order to reduce the risk of substrate fracture or undesirable deformation of the plugs during bonding.

In some embodiments, the press may also include one or more heating elements for heating the substrates. As such, the press may be configured to heat the first and second substrates 100, 200 to a temperature of at least 100° C. In some embodiments the press may be configured to heat the first and second substrates 100, 200 to a temperature of at least: 200° C., 300° C., 400° C., or 500° C. The press may be configured to hold the first and second substrates 100, 200 under compression, and optionally at temperature for a time period. In some embodiments, the time period may be at least: 1 minute, 2 minutes, 5 minutes, 10 minutes of 1 hour. Accordingly, a press may be used to improve the formation of direct, fusion bonds at the interface between the first and second substrates 100, 200.

Thus, in accordance with the above description, a method of preparing a substrate for bonding may be provided. A method of bonding two substrates together is also provided in accordance with this disclosure. It will be appreciated that the method of preparing a substrate for bonding may be used to provide on or more substrates for use in the method of bonding two substrates together described above.

The invention claimed is:

1. A method of preparing a substrate for substrate bonding comprising:
    forming a recess in a substrate surface of the substrate;
    forming a bondable dielectric layer on the substrate surface of the substrate having a bonding surface on an opposite side of the bondable dielectric layer to the substrate surface, the recess and the bondable dielectric layer defining a dielectric cavity having a dielectric cavity volume;
    forming a plug configured to make electrical contact to the substrate in the dielectric cavity volume, the plug having a plug volume which is less than the dielectric cavity volume, wherein the plug extends from the dielectric cavity beyond the bonding surface in a direction generally normal to the bonding surface; and
    coining the plug by compressing the substrate between opposing planar surfaces such that a contact surface of the plug is made co-planar with the bonding surface.

2. A method of preparing a substrate according to claim 1, wherein,
    the plug extends from the dielectric cavity beyond the bonding surface by no more than 5 μm.

3. A method of preparing a substrate for bonding according to claim 1, wherein
    following coining the plug has a cross sectional area co-planar with the bonding surface of less than 10 μm×10 μm.

4. A method of preparing a substrate for bonding according to claim 1, the volume of the dielectric cavity volume is at least 10% greater than the plug volume of the plug.

5. A method of preparing a substrate for bonding according to claim 1, further comprising:
    subjecting the bonding surface to an activation treatment, wherein optionally the bonding surface is exposed to a solution comprising OH⁻ ions following the activation treatment.

6. A method of preparing a substrate for substrate bonding according to claim 1, wherein the plug comprises a noble metal.

7. A method of preparing a substrate for substrate bonding according to claim 1, wherein
    the bondable dielectric layer comprises a silicon compound, wherein optionally, the bondable dielectric layer comprises at least one of: Silicon Dioxide, Silicon Nitride, Silicon Oxynitride, or Silicon Carbon nitride.

8. A method of preparing a substrate for substrate bonding according to claim 1, wherein a plurality of recesses are formed on the substrate surface, and each recess has a plug formed within.

9. A method of bonding a first substrate to a second substrate comprising:
    i) preparing the first substrate for bonding comprising:
        forming a first recess in a first substrate surface of the first substrate;
        forming a first bondable dielectric layer on the first substrate surface of the first substrate having a first bonding surface on an opposite side of the first bondable dielectric layer to the first substrate surface, the first recess and the first bondable dielectric layer defining a first dielectric cavity having a first dielectric cavity volume;
        forming a first plug configured to make electrical contact to the first substrate in the first dielectric cavity volume, the first plug having a first plug volume which is less than the first dielectric cavity volume, wherein the first plug extends from the first dielectric cavity beyond the first bonding surface in a direction generally normal to the first bonding surface; and
        coining the first plug by compressing the first substrate between opposing planar surfaces;
    ii) providing the second substrate for bonding, the second substrate comprising a second bondable dielectric layer and a second contact layer, provided on a second surface of the second substrate, the second contact layer having a second contact surface which is co-planar with a second dielectric surface of the second bondable dielectric layer to form a second bonding surface;
    iii) aligning the first bonding surface of the first substrate opposite the second bonding surface of the second substrate such that the first plug is aligned with the second contact layer; and
    iv) bringing the first bonding surface of the first substrate into contact with the second bonding surface of the second substrate and forming a bond between the first plug and the second contact layer under compressive force.

10. A method of bonding a first substrate to a second substrate according to claim 9, wherein
    the first bonding surface and/or the second bonding surface is subjected to an activation treatment, wherein optionally the first and/or second bonding surface is exposed to a solution comprising OH⁻ ions following the activation treatment.

11. A method of bonding a first substrate to a second substrate according to claim 9, wherein
a cross-sectional area of the first plug in the plane of the first bonding surface is less than a surface area of the second contact surface.

12. A method of bonding a first substrate to a second substrate according to claim 9, wherein providing the second substrate for bonding comprises:
forming a second recess in the second substrate surface of the second substrate;
forming the second bondable dielectric layer on the second substrate surface of the second substrate having the second bonding surface on an opposite side of the second bondable dielectric layer to the second substrate surface, the second recess and the second bondable dielectric layer defining a second dielectric cavity having a second dielectric cavity volume;
forming a second plug configured to make electrical contact to the second substrate in the second dielectric cavity volume, the second plug having a second plug volume which is less than the second dielectric cavity volume, wherein the second plug extends from the second dielectric cavity beyond the second bonding surface in a direction generally normal to the second bonding surface; and
coining the second plug by compressing the second substrate between opposing planar surfaces such that the second plug forms the second contact layer having the second contact surface which is co-planar with the second bonding surface.

13. A method of bonding a first substrate to a second substrate according to claim 9, wherein
when preparing the first substrate for substrate bonding, the first plug extends from the dielectric cavity beyond the bonding surface by no more than 5 μm.

14. A method of bonding a first substrate to a second substrate according to claim 9, wherein
the second contact layer is made co-planar with the second dielectric surface using a chemical mechanical polishing process.

\* \* \* \* \*